(12) United States Patent
Lee

(10) Patent No.: US 6,855,592 B2
(45) Date of Patent: Feb. 15, 2005

(54) METHOD FOR MANUFACTURING SEMICONDUCTOR DEVICE

(75) Inventor: Wan Gyu Lee, Chongju (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/289,354

(22) Filed: Nov. 7, 2002

(65) Prior Publication Data

US 2003/0113988 A1 Jun. 19, 2003

(30) Foreign Application Priority Data

Dec. 15, 2001 (KR) .......................................... 2001-79644

(51) Int. Cl.$^7$ ..................... H01L 21/04; H01L 21/8238; H01L 21/4763
(52) U.S. Cl. ..................... 438/231; 438/232; 438/511; 438/648
(58) Field of Search ............................... 438/231, 232, 438/511, 648, 651, 655

(56) References Cited

U.S. PATENT DOCUMENTS

| | | | |
|---|---|---|---|
| 5,047,367 A | * 9/1991 | Wei et al. .................... | 438/607 |
| 5,496,750 A | * 3/1996 | Moslehi ....................... | 438/297 |
| 5,691,215 A | * 11/1997 | Dai et al. .................... | 438/305 |
| 5,731,239 A | * 3/1998 | Wong et al. ................. | 438/296 |
| 5,763,923 A | 6/1998 | Hu et al. ..................... | 257/382 |
| 6,004,879 A | 12/1999 | Hu et al. ..................... | 438/682 |
| 6,051,881 A | * 4/2000 | Klein et al. ................. | 257/756 |
| 6,194,298 B1 | * 2/2001 | Chen et al. .................. | 438/592 |
| 6,238,989 B1 | 5/2001 | Wc Huang et al. ......... | 438/319 |
| 6,242,333 B1 | * 6/2001 | McNeil et al. .............. | 438/592 |
| 6,294,415 B1 | 9/2001 | Tseng et al. ................ | 438/197 |
| 6,326,289 B1 | 12/2001 | Rodder et al. .............. | 438/592 |
| 2003/0003723 A1 | * 1/2003 | Lee ............................. | 438/664 |

* cited by examiner

*Primary Examiner*—William M. Brewster
(74) *Attorney, Agent, or Firm*—Piper Rudnick LLP

(57) ABSTRACT

A method for manufacturing a semiconductor device is disclosed, in which characteristics of the semiconductor device and an operation speed are improved. In forming sidewall spacers at both sides of a gate electrode, a semiconductor substrates is partially removed at both sides of the sidewall spacer by controlling an etch gas, and then a process for forming a silicide layer is performed, thereby increasing a distance between the silicide layer and a channel. Accordingly, it is possible to decrease a resistance material between the silicide layer and the channel region.

21 Claims, 5 Drawing Sheets

METHOD FOR MANUFACTURING SEMICONDUCTOR DEVICE

This application claims the benefit of the Korean Application No.2001-79644 filed on Dec. 15, 2001, which is hereby incorporated by reference.

BACKGROUND OF THE INVENTION

1. Field of the Invention

The present invention relates to a method for manufacturing a semiconductor device, and more particularly, to a method for manufacturing a semiconductor device to improve efficiency and operation speed.

2. Discussion of the Related Art

Generally, in a field-effect transistor (FET) of an existing metal oxide semiconductor (MOS) structure, a region contacted to a transistor driving circuit is made of titanium silicide or cobalt silicide so as to decrease a contact resistance between the transistor and the transistor driving circuit. That is, the cobalt silicide ($CoSi_2$) is formed on a transistor having a gate length of 0.18 μm or less, which substitutes for tungsten silicide ($WSi_2$) and titanium silicide ($TiSi_2$) that have been used for a prior art transistor.

The cobalt silicide ($CoSi_2$) is formed in the following process steps. A silicon substrate is prepared, and impurity ions are injected into the silicon substrate to form source/drain regions. Subsequently, a rapid thermal processing (RTP) process is performed on the silicon substrate so as to activate the impurity ions, and a double layer of cobalt (Co) and titanium (Ti) is deposited on the silicon substrate. A rapid heat treatment process is performed on the silicon substrate in an atmosphere of $N_2$.

The aforementioned cobalt silicide increases a saturation current value, so that device turning on/off characteristic is improved, thereby easily driving the device at a low voltage. Also, the contact resistance decreases between a line and the transistor, thereby improving an operation speed of the device. Accordingly, the silicide process is necessary to form a logic device.

A prior art method for manufacturing a semiconductor device will be explained with reference to the accompanying drawings.

FIG. 1A to FIG. 1E are sectional views illustrating the prior art method for manufacturing the semiconductor device.

As shown in FIG. 1A, an active region and a field region are defined on a semiconductor substrate 11. The field region of the semiconductor substrate 11 is etched at a predetermined depth through photolithography and etching processes, thereby forming a trench. Then, the trench is filled with an insulating material, so that a barrier 12 is formed on the field region of the semiconductor substrate 11. A gate insulating layer 13 is formed on an entire surface of the semiconductor substrate 11 including the barrier 12, and a poly silicon layer 14 as a gate electrode is formed on the gate insulating layer 13. After that, n-type or p-type impurity ions are selectively injected to the poly silicon layer 14, and a predopping anneal process is performed thereon.

Referring to FIG. 1B, the poly silicon layer 14 and the gate insulating layer 13 are selectively removed through photolithography and etching processes, thereby forming the gate electrode 14a. Then, lightly doped drain (LDD) ions are injected to the entire surface of the semiconductor substrate 11 by using the gate electrode 14a as a mask, thereby forming an LDD region 15 at both sides of the gate electrode 14a on the surface of the semiconductor substrate 11. If the semiconductor substrate 11 is in a state of p-type, n-type impurity ions are injected to the semiconductor substrate 11. Meanwhile, if the semiconductor substrate 11 is in a state of n-type, p-type impurity ions are injected to the semiconductor substrate 11.

After forming the insulating layer on the entire surface of the semiconductor substrate 11 including the gate electrode 14a shown in FIG. 1C, an etching back process is performed on the entire surface of the semiconductor substrate, thereby forming sidewall spacers 16 at both sides of the gate electrode 14a. Subsequently, heavily doped n-type impurity ions are injected into the entire surface of the semiconductor substrate 11 by using the gate electrode 14a and the sidewall spacer 15 as the mask, so that source/drain regions 17 are formed on the surface of the semiconductor substrate 11.

As shown in FIG. 1D, a cobalt layer 18 and a titanium layer 19 are sequentially deposited on the entire surface of the semiconductor substrate 11 including the gate electrode 14a. The heat treatment is performed on the semiconductor substrate 11, and a cobalt silicide layer 20 is formed on the surface of the semiconductor substrate 11 including the poly silicon layer 14 and source/drain regions 17. Subsequently, the titanium layer 19 and the cobalt layer 18 are removed by wet-etching process, which are not reactive on the surfaces of the polysilicon layer 14 and the source/drain regions 17.

However, the prior art method for manufacturing the semiconductor device has the following problems.

In the prior art method for manufacturing the semiconductor device, the silicide layer is distant from a channel region, so that a resistant material increases between the silicide layer and the channel region, thereby deteriorating device quality and operation speed.

SUMMARY OF THE INVENTION

Accordingly, the present invention is directed to a method for manufacturing a semiconductor device that substantially obviates one or more problems due to limitations and disadvantages of the prior art.

An object of the present invention is to provide to a method for manufacturing a semiconductor device, in which a distance is decreased between a silicide layer and a channel region, so that decreasing a resistance material between the silicide layer and the channel region, thereby improving operation speed and device quality.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for manufacturing a semiconductor device according to the present invention includes forming a barrier for isolating devices from one another on a semiconductor substrate; forming a gate electrode by selectively removing a gate insulating layer on the semiconductor substrate; forming LDD regions at both sides of the gate electrode on the semiconductor substrate; forming an insulating layer on an entire surface of the semiconductor substrate including the gate electrode; forming sidewall spacer at both sides of the gate electrode by selectively removing the insulating layer, simultaneously, etching the semiconductor substrate at a predetermined thickness; performing a cleaning process on the semiconductor substrate; forming source and drain regions at both sides of the gate electrode on the semiconductor substrate; performing PAI process on the entire surface of the semiconductor substrate; and forming a metal silcide layer on surfaces of the gate electrode and the source/drain regions.

The method according to the present invention further includes depositing an oxide layer on the entire surface of the semiconductor substrate before PAI process, and selectively removing the oxide layer on the semiconductor substrate except for portions of input and output terminals through photolithography and etching processes.

Preferably, a gas mixing $CHF_3$, $CF_4$ and Ar is used for selectively removing the insulating layer.

Also, a method for forming the metal silicide layer includes sequentially depositing first and second metal layers on the entire surface of the semiconductor substrate including the gate electrode, forming the metal silicide layer on the gate electrode and source/drain regions through a first heat treatment on the semiconductor substrate, removing the first and second metal layers that are not reactive on the gate electrode and source/drain regions, and performing a second heat treatment on the semiconductor substrate.

Preferably, the first metal layer is made of cobalt, and the second metal layer is made of titanium.

Preferably, the first heat treatment is performed at a lower temperature as compared to the second heat treatment.

Preferably, in order to remove the first and second metal layers that are not reactive on the gate electrode and the source/drain regions, a wet etch process is performed with the solution mixing $NH_3OH$, $H_2O_2$ and $H_2O$, and then is performed with a solution mixing HCl, $H_2O_2$ and $H_2O$.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIG. 2A to FIG. 2G are views illustrating manufacturing process steps of a semiconductor device according to the present invention.

Figure 1A:
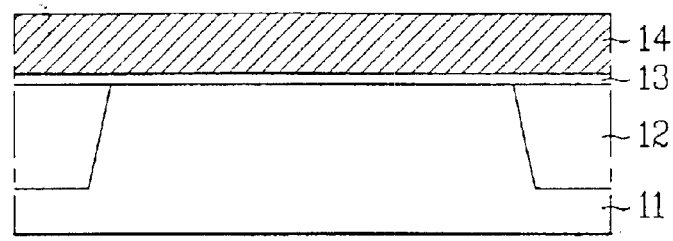
FIG. 1A to FIG. 1E are views illustrating manufacturing process steps of a prior art semiconductor device.
Figure 1B:
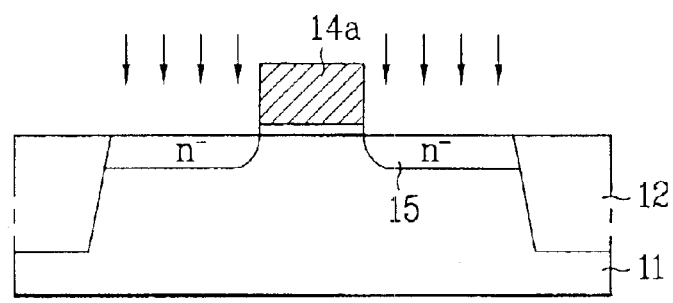
Figure 1C:
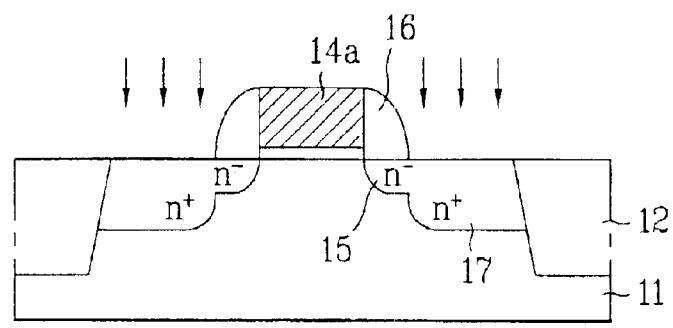
Figure 1D:
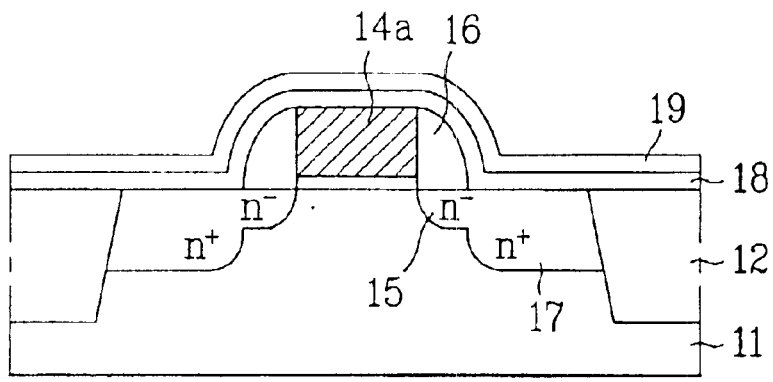
Figure 1E:
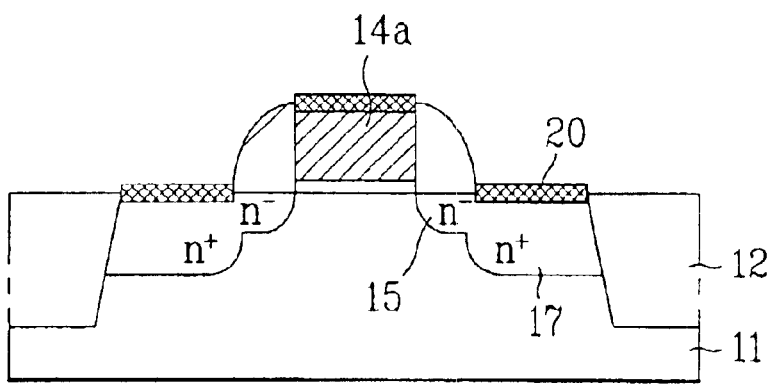
Figure 2A:
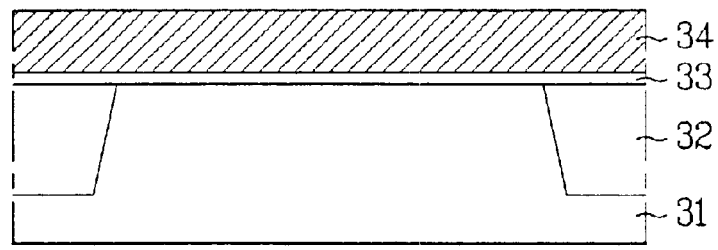
FIG. 2A to FIG. 2G are views illustrating manufacturing process steps of a semiconductor device according to the present invention.

As shown in FIG. 2A, an active region and a field region are defined on a semiconductor substrate 31, and a barrier 32 is formed on the field region of the semiconductor substrate 31. Then, the field region of the semiconductor substrate 31 is etched at a predetermined depth through photolithography and etching processes, thereby forming a trench. The trench is filled with an insulating material, thereby forming the barrier 32. Also, the barrier 32 may be formed in a LOCal Oxidation of Silicon (LOCOS) method. A gate insulating layer 33 is formed on an entire surface of the semiconductor substrate 31 including the barrier 32, and a poly silicon layer 34 as a gate electrode is formed on the gate insulating layer 33. Then, n-type impurity ions or n-type impurity ions are selectively injected into the poly silicon layer 34.

If both NMOS transistor and PMOS transistor are formed on the semiconductor substrate, a mask is formed on a first region of the semiconductor substrate on which the NMOS transistor is formed. Then, n-type impurity ions are injected to a second region of the semiconductor substrate on which the PMOS transistor is formed, and a mask is formed on the second region. After that, p-type impurity ions are injected to the first region of the semiconductor substrate. On the contrary, p-type impurity ions are firstly injected to the first region of the semiconductor substrate, and then n-type impurity ions are injected to the second region of the semiconductor substrate. After injecting the n-type and p-type impurity ions on the semiconductor substrate, an anneal process is performed to activate the n-type and p-type impurity ions.

Figure 2B:
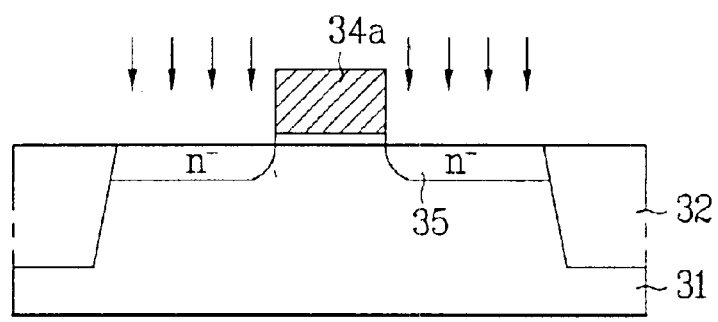

As shown in FIG. 2B, the poly silicon layer 34 and the gate insulating layer 33 are selectively removed through photolithography and etching processes, thereby forming a gate electrode 34a. Subsequently, lightly doped drain impurity ions are injected to the entire surface of the semiconductor substrate 31 by using the gate electrode 34a as the mask, thereby forming an LDD region 35 at both sides of the gate electrode 34a. If the semiconductor substrate 31 is in a state of P-type, n-type impurity ions are injected to the semiconductor substrate as impurity ions for forming the LDD region. If the semiconductor substrate 31 is in a state of N-type, P-type impurity ions as the LDD impurity ions are injected to the semiconductor substrate. At this time, the LDD impurity ions are injected at an energy of 30 KeV and a dose of 5E15.

Figure 2C:
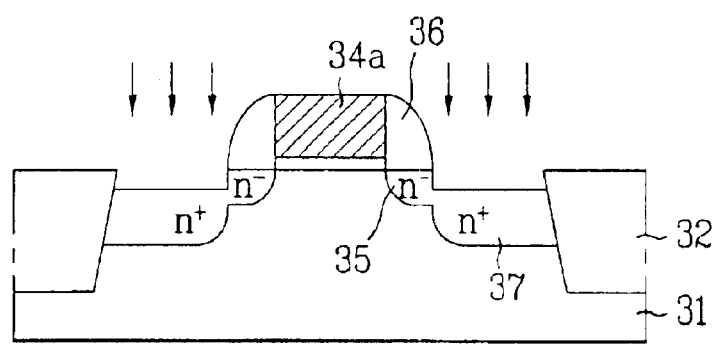

As shown in FIG. 2C, an insulating layer (for example, a nitride layer) is formed on the entire surface of the semiconductor substrate 31 including the gate electrode 34a, and the etch back process is performed on the entire surface of the semiconductor substrate 31. At this time, sidewall spacers 36 are formed at both sides of the gate electrode 34a, and then the semiconductor substrate 31 is removed in both sides of the gate electrode 34a at a predetermined depth.

The etch back process for forming the sidewall spacer 36 is performed in a dry etch method using $CHF_3$, $CF_4$ or Ar gas. In this method, $CHF_3$ or $CF_4$ gas is used about 300 sccm or less, and Ar gas is used about 2000 sccm or less. The etch back process is performed in a vacuum chamber with plasma for 15 seconds.

A cleaning process is performed on the entire surface of the semiconductor substrate 31 including the sidewall spacer 36 with a solution mixing $H_2O$ with HF at a ratio of 99 to 1. Also, the cleaning process is performed at a temperature of 25° C.

Subsequently, heavily doped impurity ions are injected into the entire surface of the semiconductor substrate 31 by using the gate electrode 34a and the sidewall spacer 36 as the mask, thereby forming source/drain regions 37 on the surface of the semiconductor substrate 31. When the impurity ions are injected to the semiconductor substrate so as to form the source/drain regions 37, p-type impurity ions or n-type impurity ions are selectively injected to the semiconductor substrate 31 for selectively forming the PMOS transistor or the NMOS transistor. In a case of that PMOS transistor is formed on the semiconductor substrate, p-type impurity ions (for example, boron B) are injected to the semiconductor substrate. In a case of that NMOS transistor is formed on the semiconductor substrate, n-type impurity ions (for example, phosphorus P) are injected on the semiconductor substrate. Subsequently, a first heat treatment is performed on the semiconductor substrate to activate the impurity ions injected into the source/drain regions 37. At this time, the semiconductor substrate is heated at a temperature between 970° C. and 1040° C. for 10 seconds to 40 seconds in a state of $N_2$ atmosphere.

Figure 2D:
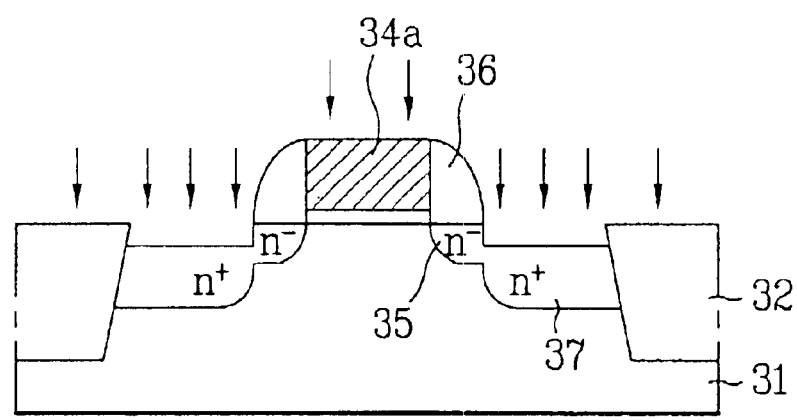

As shown in FIG. 2D, the cleaning process is performed on the entire surface of the semiconductor substrate 31, thereby removing an oxide layer (not shown) generated during the first heat treatment. Also, pre-amorphization Implant (PAI) process is performed so as to decrease poly silicon grain size of the gate electrode 34a and the semiconductor substrate 31. At this time, Ar gas is injected into the semiconductor substrate at energy of 10 KeV to 20 KeV, and a dose of 2E13

If a metal thin film is deposited to form a silcide layer in a state of that the oxide layer is not removed, the oxide layer functions as a diffusion barrier during a heat treatment process, thereby preventing the silicide layer from being formed. The oxide layer generates serious problems in forming a cobalt silicide layer.

To solve theses problems, PAI process is performed to decrease the poly silicon grain size by injecting ions of a heavy element such as Me, As or Ar to the poly silicon before depositing the cobalt layer.

Figure 2E:
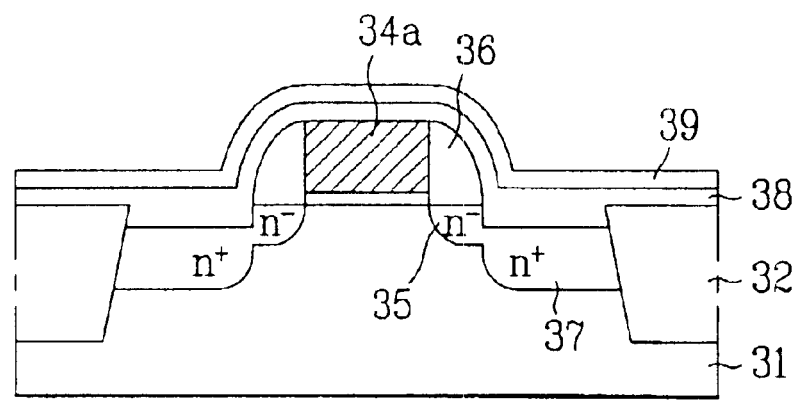

As shown in FIG. 2E, the cobalt layer 38 and the titanium layer 39 are deposited on the entire surface of the semiconductor substrate 31 including the gate electrode 34a at a thickness of 120 Å to 270 Å in a vacuum state by a physical deposition method.

Figure 2F:
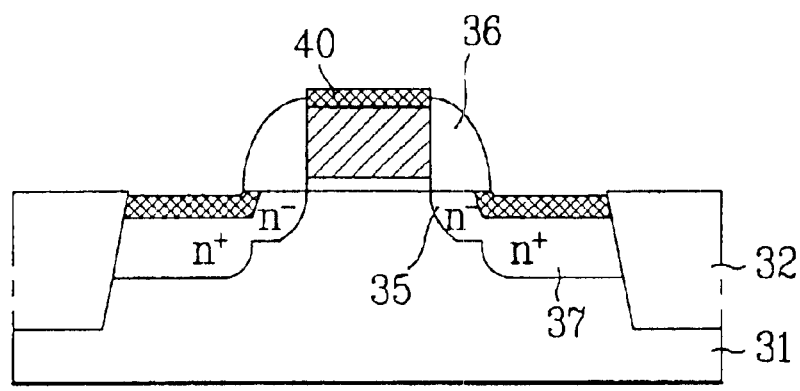

Referring to FIG. 2F, a second heat treatment is performed on the semiconductor substrate 31, thereby forming a cobalt silicide layer 40 on the surface of the semiconductor substrate 31 including the gate electrode 34a and source/drain region 37. The semiconductor substrate is heated in a state of $NH_3$, $N_2$ or Ar atmosphere at a temperature of 500° C. to 630° C. for several seconds by a rapid heat treatment device.

The titanium layer 39 and cobalt layer 38 are not reactive on the poly silicon layer 34 and the source/drain region 37, so that the titanium layer 39 and cobalt layer 38 are removed in a wet etch process.

At this time, the wet etch process is performed with a solution mixing $NH_4OH$, $H_2O_2$ and $H_2O$ at a ratio of 1:5:50 for 14 minutes or more, and then is performed with a solution mixing HCl, $H_2O_2$ and $H_2O$ at a ratio of 1:1:5. The wet etch process is performed at a temperature of 50° C.

During forming the cobalt silicide layer 40, the cobalt silicide layer 40 may be formed on the rest of the semiconductor substrate except for portions of input and output terminals. In this method, following process steps may be additionally required, depositing an HLD oxide layer on the semiconductor substrate at a thickness of 500 Å to 1000 Å between PAI cleaning process and the cleaning process, performing photolithography and dry etch processes on the semiconductor substrate to remove the HLD oxide layer on the surface of the semiconductor substrate except for the portion of the input and output terminals, and cleaning the semiconductor substrate for removing foreign matters.

Subsequently, a third heat treatment is performed on the entire surface of the semiconductor substrate 31 including the cobalt silcide layer 40 by a rapid heat treatment device. The semiconductor substrate 31 is heated at a temperature of 740° C. to 780° C. for several seconds.

In order to form the cobalt silicide layer 40 on the semiconductor substrate, the semiconductor substrate is heated twice. If the semiconductor substrate is heated at a high temperature once, the cobalt silicide layer may be formed on undesired portions, the sidewall spacer 36. Accordingly, the semiconductor substrate is heated at a low temperature between 500° C. and 630° C. in the second heat treatment process, and then is heated at a high temperature between 740° C. and 780° C., thereby forming the cobalt silicide layer 40 having a low resistance value.

Figure 2G:
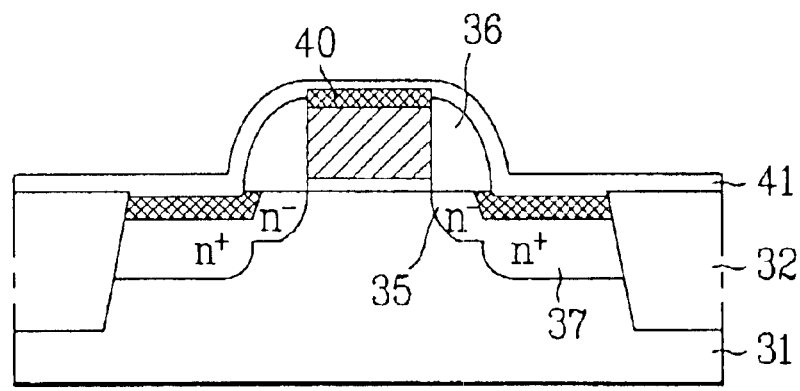

As shown in FIG. 2G, a nitride layer 41 is deposited on the entire surface of the semiconductor substrate 31 including the cobalt silicide layer 40 by injecting TEOS gas or ammonia gas into a vacuum chamber in which the semiconductor substrate 31 is provided.

As mentioned above, the method for manufacturing the semiconductor device according to the present invention has the following advantages.

First, the silicide layer is formed under the sidewall spacer in the source/drain regions, so that the distance between the silicide layer and the channel becomes short, thereby improving electrical characteristic of the device.

Also, a saturation current of the transistor increases, so that it is possible to drive the transistor at a low voltage.

In order to obtain the desired saturation current of the transistor, a rapid heat treatment may be performed at a lower temperature than the prior art, thereby increasing a process margin.

In fabricating a device having a gate length of 0.18 μm or less, boron B doped on the source/drain regions of the PMOS spreads to the gate insulating layer, so that it may generate problems in processing steps, or it may decrease the process margin. However, if the rapid heat treatment is performed at a low temperature, the process margin increases, thereby improving a yield in mass production of the device.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for manufacturing a semiconductor device comprising:

forming a barrier for isolating devices from one another on a semiconductor substrate;

forming a gate insulating layer on the semiconductor substrate;

forming a gate electrode on the gate insulating layer;

forming LDD regions in the semiconductor substrate at both sides of the gate electrode;

forming an insulating layer on an entire surface of the semiconductor substrate including the gate electrode;

forming sidewall spacer at both sides of the gate electrode by selectively removing the insulating layer, simultaneously, etching the semiconductor substrate at a predetermined thickness;

performing a cleaning process on the semiconductor substrate;

forming source and drain regions on the surface of the semiconductor substrate;

decreasing a grain size of the gate electrode, source and drain regions by performing a pre-amorphization implant (PAI) process; and forming a metal silcide layer on surfaces of the gate electrode and the source/drain regions.

2. The method as claimed in claim 1, wherein $CHF_3$, $CF_4$ or Ar gas is used for selectively removing the insulating layer.

3. The method as claimed in claim 2, wherein $CHF_3$ and $CF_4$ are respectively used about 300 sccm or less, and Ar is used about 2000 sccm or less.

4. The method as claimed in claim 1, wherein a method for forming the metal suicide layer comprising;

sequentially depositing first and second metal layers on the entire surface of the semiconductor substrate including the gate electrode, forming the metal silicide layer on the gate electrode and source/drain regions through a first heat treatment on the semiconductor substrate, removing the first and second metal layers that are not reactive on the gate electrode and source/drain regions, and performing a second heat treatment on the semiconductor substrate.

5. The method as claimed in claim 4, wherein the first heat treatment is performed at a lower temperature as compared to the second heat treatment.

6. The method as claimed in claim 4, wherein the first heat treatment is performed at a temperature of 500° C. to 630° C.

7. The method as claimed in claim 4, wherein the second heat treatment is performed at a temperature of 740° C. to 780° C.

8. The method as claimed in claim 4, wherein the first metal layer is made of cobalt, and the second metal layer is made of titanium.

9. The method as claimed in claim 4, wherein the first and second metal layers are deposited on the semiconductor substrate in a vacuum state by a physical deposition method.

10. The method as claimed in claim 4, wherein the first and second metal layers are formed at a thickness between 120 Å and 270 Å.

11. The method as claimed in claim 4, wherein the first and second metal layers that are not reactive on the gate electrode and source/drain regions are removed in a wet etch process.

12. The method as claimed in claim 11, wherein a solution mixing $NH_3OH$, $H_2O_2$ and $H_2O$ at a ratio of 1:5:50 is used in the wet etch process.

13. The method as claimed in claim 11, wherein the wet etch process is performed with the solution mixing $NH_3OH$, $H_2O_2$ and $H_2O$ at the ratio of 1:5:50 about 50° C. for 14 minutes or more, and then is performed with a solution mixing HCl, $H_2O_2$ and $H_2O$ at a ratio of 1:1:5 about 50° C.

14. The method as claimed in claim 1, further comprising heating the semiconductor substrate by a rapid heat treatment before PAT process, after forming the source/drain regions.

15. The method as claimed in claim 14, wherein the heat treatment is performed in a state of $N_2$ atmosphere at a temperature of 970° C. to 1040° C. for 10 seconds to 40 seconds.

16. The method as claimed in claim 1, wherein the cleaning process is performed with a solution mixing $H_2O$ with HF at a ratio of 99 to 1 about 25° C.

17. The method as claimed in claim 1, wherein Ar gas is injected into the gate electrode and the source/drain regions at energy of 10 KeV to 20 KeV and at a dose of 2E13 during PAI process.

18. The method as claimed in claim 1, further comprising forming a nitride layer on the semiconductor substrate including the metal silicide layer.

19. The method as claimed in claim 18, wherein the nitride layer is formed by injecting ammonia gas and TEOS gas in a chamber at a temperature of 700° C. or less.

20. The method as claimed in claim 1, further comprising;

depositing an oxide layer on the entire surface of the semiconductor substrate before PAI process, and selectively removing the oxide layer on the semiconductor substrate except for portions of input and output terminals through photolithography and etching processes.

21. The method as claimed in claim 20, wherein the oxide layer is formed at a thickness between 500 Å and 1000 Å.

* * * * *